United States Patent [19]

Reddy

[11] 4,311,974
[45] Jan. 19, 1982

[54] WIDE BAND DIRECTIONAL COUPLER
[75] Inventor: Prabhakara Reddy, Fayetteville, N.Y.
[73] Assignee: Eagle Comtronics, Inc., Clay, N.Y.
[21] Appl. No.: 158,066
[22] Filed: Jun. 9, 1980
[51] Int. Cl.³ .......................................... H03H 7/52
[52] U.S. Cl. .................................. 333/112; 333/119
[58] Field of Search ................... 333/112, 118, 119; 455/3

[56] References Cited
U.S. PATENT DOCUMENTS

| | | | |
|---|---|---|---|
| 3,559,110 | 1/1971 | Wiley et al. | 333/112 |
| 3,747,028 | 7/1973 | Pennypacker | 333/112 |

Primary Examiner—Paul L. Gensler

[57] ABSTRACT

A directional coupler for sampling energy traversing a CATV system of the type wherein wide band television signals are extracted from a coaxial transmission line situated at points located at varying distances from the line amplifier. The coupler includes a voltage sensing transformer in shunt with the center and outer conductors of the cable and a current sensing transformer in series with the center conductor. The transformers are wound to provide the coupler with a relatively low tap value. Windings in the shunt transformer are used to internally boost the impedance at the input to the series transformer to maximize return losses and directivity.

10 Claims, 3 Drawing Figures

WIDE BAND DIRECTIONAL COUPLER

BACKGROUND OF THE INVENTION

This invention relates to an improved directional coupler for use in a CATV system and, in particular, to a directional coupler having a relatively low tap value and a relatively high return loss and directivity.

In CATV systems, wide band television signals are typically transmitted by coaxial cable over relatively long distances. Amplifiers are situated at various intervals along the lines to maintain the signal strength at or above a desired operating level. Samples of the broadcast signal are extracted from the line at increasing distances from the amplifier. The broadcast signals are tapped from the main transmission line by means of directional couplers.

A directional coupler in common usage includes a first current sensing transformer that is connected in series with the center conductor of the cable to apply a first current sample to an output tap point. A second transformer is placed in shunt between the center conductor and the grounded outer conductor of the cable and is arranged to apply a second voltage sample to the output tap. Cablecast signals moving over the line from the amplifier toward the load cause the sample signals to be additive at the output tap point. Reflected signals moving in the opposite direction along the cable on the other hand cause the sample signals at the tap point to be 180° out of phase whereby the signals cancel each other. The coupler in effect prevents these unwanted reflected signals from reaching the subscriber's receiver where it would produce distortions.

Rheinfelder in U.S. Pat. No. 3,543,163 describes a typical cable arrangement in which an amplifier is used to transmit a wide band signal over a specified length of cable. Seven directional couplers are situated at intervals of about 150 feet. As noted by Rheinfelder, insertion losses and line loss are experienced as the signal moves further away from the amplifier. As a result, the tap value of the couplers is reduced periodically in order to maintain the signal level at the subscriber's set at a level required for good reception. The nominal tap loss of the coupler becomes compressed the further the coupler is located from the amplifier. Normally, the tap value of the coupler is generally not allowed to drop below 12 dB because the reflection losses at these low values are typically high.

Some added disadvantages of conventional directional taps having low values are poor frequency response, high insertion losses and reduced isolation.

SUMMARY OF THE INVENTION

It is therefore an object of the present invention to increase the usable length of a CATV transmission line without increasing the output level of the line amplifier.

A further object of the present invention is to provide a directional coupler having a relatively low tap value and improved input to output impedance matching characteristics.

It is another object of the present invention to provide a directional coupler having a low tap value and a low insertion loss.

Another object of the present invention is to provide a directional coupler having a low tap value and good directivity.

Yet another object of the present invention is to provide a directional coupler having a low tap value and a good frequency response.

These and other objects of the present invention are attained by a directional coupler having a shunt transformer for providing a voltage sample of a wide band television signal moving in a preselected direction along a coaxial transmission cable and a series transformer for providing a current sample of the wide band signal. The two sample signals are applied to a common output tap point from where it can be split and forwarded onto one or more subscriber terminals. The two transformers are wound to provide the coupler with a relatively low nominal tap value whereby the coupler is suitable for use at an extended distance from the line amplifier. The windings of the shunt transformer are arranged to boost the internal impedance of the coupler at the input to the series transformer to a value that is greater than the characteristic line impedance thereby maximizing the return loss and directivity of the device.

BRIEF DESCRIPTION OF THE DRAWINGS

For a better understanding of these and other objects of the present invention, reference is had to the following detailed description of the invention which is to be read in conjunction with the accompanying drawings, wherein.

DESCRIPTION OF THE INVENTION

Figure 1:
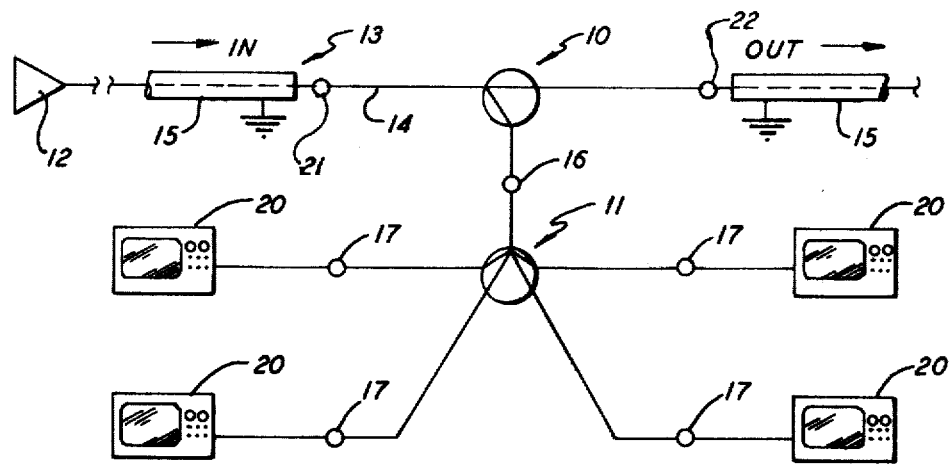
FIG. 1 is a schematic diagram of a typical transmission line employing a directional coupler embodying the teachings of the present invention.

Referring initially to FIG. 1, there is shown a transmission line 13 as is typically employed in a CATV system. The line is serviced by an amplifier 12 that is adapted to raise the broadcast signal level to a desired operating level, usually being somewhere around 43 dBmv, and transmit the signals along the cable in the direction of the arrows. Situated along the length of the line are a series of directional couplers 10 used to extract a sample of the transmitted signal from the line and pass the sample on to one or more subscriber locations.

Conventionally, the line 13 is a coaxial cable having a center conductor 14 and a grounded outer conductor 15 which is in the form of a shield. The line is generally broken at each coupler site and the coupler connected in series with the central conductor using input terminal 21 and output terminal 22. The coupler further includes an output tap point 16 to which is applied the sample signals that are tapped from the main transmission line. The output tap is normally coupled to a signal splitter 11 where the signal is split and passed on to a number of different drop points 17. The splitter can be of any suitable design utilizing coils having a RF resistance bearing predetermined ratios to the characteristic impedances of the input and output lines. Each drop point is capable of being activated to permit the sample signal to reach the television receiver 20—20 of a subscriber.

Figure 2:
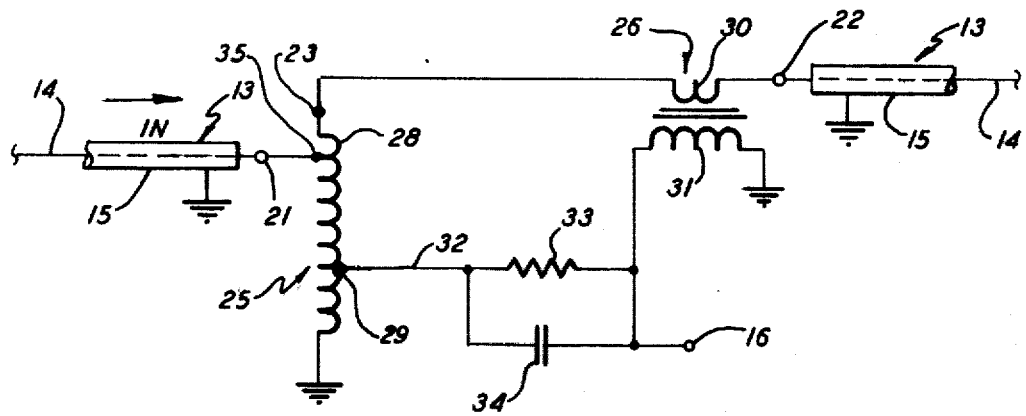
FIG. 2 is a wiring diagram of a directional coupler embodying the teachings of the present invention.

Turning now to FIG. 2, there is shown a wiring diagram of a directional coupler embodying the teaching of the present invention. As shown, the coaxial line 13 is broken at the sampling station and the center conductor 14 thereof is connected to the input terminal 21 and the output terminal 22 of the coupler. The coupler includes a current sampling transformer, generally referenced 26, having a primary section 30 that is in series with the center conductor of the cable. The secondary section 31 of the current transformer is connected between ground and the output tap point 16 used to develop a first current sensing sample.

An autotransformer generally referenced 25 is placed in a shunt position at the input to the coupler. The autotransformer contains a single set of windings that are electrically connected between node 23 and ground. The windings also include a pair of intermediate taps that shall herein be referred to as first intermediate tap 35 and second intermediate tap 29. The first intermediate tap 35 is connected directly to the input terminal of the coupler. The second intermediate tap 29 is, in turn, connected to the output tap point 16 through a resistor 33. The winding of the transformer between tap 29 and ground serve to develop a voltage sensing sample that is coupled to the output tap point 16 along with the first current sensing sample. A compensation capacitor 34 is connected in parallel with resistor 33.

As can be seen, a portion of the autotransformer windings 28 is connected between the intermediate tap 35 and the node 23. The primary section 30 of the series transformer 26 is connected between node 23 and the output terminal 22 of the coupler. As a result of this arrangement, the upper portion 28 of the autotransformer is electrically placed in series with the input terminals of the coupler and the primary section of the series transformer. Accordingly, the impedance at the input to the series transformer is raised to some value that is greater than the characteristic impedance of the line.

The windings of the two transformers are arranged so that the cablecast signals moving outwardly from the line amplifier toward the system load as indicated by the arrow in FIG. 2 will cause a pair of sample signals to be applied at the output tap point 16 that are in phase. Accordingly, the two sample signals are added at the tap. Because of imperfect termination of the broadcast signals at the various sampling stations, "reflected" waves are passed in the opposite direction along the transmission line back towards the amplifier. The windings of the transformers, however, are such that the sample signals produced by these reflected waves are 180° out of phase at the output tap point and therefore cancel each other out.

As noted in the previously mentioned Rheinfelder patent, the wide band signals, as they move out from the amplifier are subjected to a number of losses. Initially, a line loss is encountered which relates directly to the number of feet of cable the signal is required to traverse. Each coupler put into the line also produces a signal attenuation which occurs between the input and the output terminal of the coupler. This loss is generally referred to as an insertion loss. The effect of these line losses are insertion losses upon the broadcast signal is cumulative so that the signal level is continually reduced as it moves outwardly from the amplifier. This, in turn, compresses the level of tap loss that can be accommodated at each subsequent tap. Eventually the tap loss becomes so low that reflection losses become a serious problem. By placing a step up transformer into the system as herein described the effects of return loss is minimized and the directivity is improved.

It has been found that inserting one turn of the autotransformer into the electrical path between the input terminal of the coupler and the primary section of the series transformer will provide sufficient impedance to improve the return loss while at the same time minimizing insertion losses. It will be understood by one skilled in the art that the configuration of the two transformers for a given nominal tap value will be, to a certain extent, dictated by the one turn limitation. A coupler having a 8 dB nominal tap rating is shown in FIG. 2 wherein the primary to secondary turns ratio of the series transformer is 2:4 and the primary to secondary turns ratio of the autotransformer is 8:3.

Figure 3:
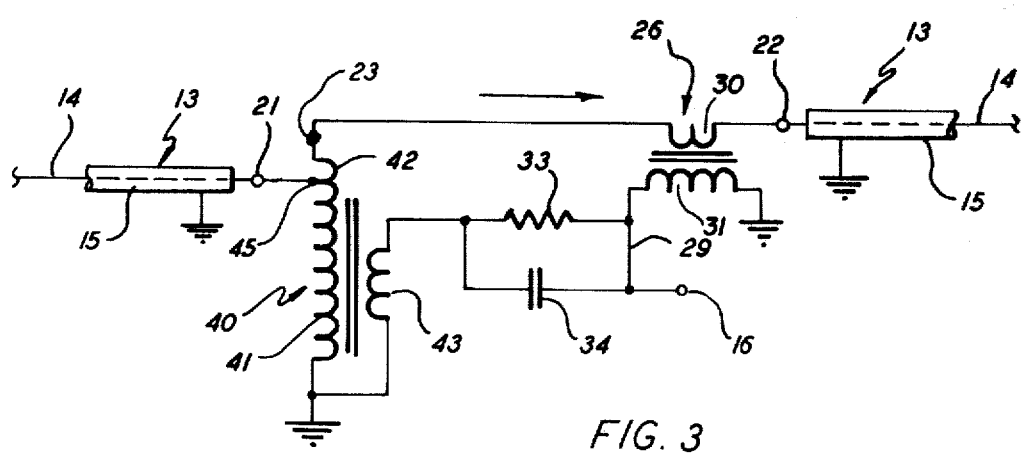
FIG. 3 is another wiring diagram showing a second embodiment of the present invention.

Turning now to FIG. 3, there is shown a second embodiment of the present invention wherein like parts as those shown in FIG. 2 are given like numbers. In this particular arrangement the autotransformer, which was shown in the shunt position in FIG. 2, is replaced by a more conventional transformer 40 having a primary section 41 and a secondary section 43. The primary section of the shunt transformer is provided with an intermediate tap 45 that is connected directly to the input terminal of the coupler. A single turn 42 of the primary windings is positioned between the input terminal 21 of the coupler and the primary section 30 of the series transformer 26. Here again the added internal impedance serves to minimize return losses thus permitting the device to operate at low tap values.

The secondary 43 of the shunt transformer is connected between ground and resistor 33 to develop the required voltage sample signal at the output tap point 16. The windings of the two transformers are arranged so that the sample signals at the output tap point are additive when the broadcast signals are travelling along the cable in the direction of the arrow and cancel each other when reflected signals are moving back along the cable in the opposite direction.

While this invention has been described with reference to the disclosure set forth above, it is not necessarily limited to this particular embodiment and this application is intended to cover any modifications or changes as may come within the scope of the present invention.

I claim:

1. A directional coupler that is adapted to be inserted into a line for transmitting wide band signals, said line having a central conductor and a grounded outer conductor, the coupler comprising an input terminal and an output terminal that are capable of being electrically connected to the central conductor of the line, a first series transformer having a primary winding and a secondary winding, one side of said primary winding being connected to the output terminal of the coupler, a second shunt transformer having a single winding connected between the other side of said primary winding and ground, said single winding having a first intermediate tap connected to the input terminal of the coupler and a second intermediate tap connected to an output tap point, said secondary winding of the first transformer being connected between the output tap point and ground so that sample signals applied to the output tap point by each transformer are in phase when the transformers are energized by wide band signals travelling along the line in a direction from the input terminal toward the output terminal of the coupler and are out of phase when energized by reflected signals travelling in the opposite direction.

2. The directional coupler of claim 1 wherein one turn of said single winding is placed between the input terminal of the coupler and the primary winding of the first transformer.

3. The directional coupler of claim 1 further comprising a resistor in series between the second intermediate tap and the output tap point of the coupler.

4. A directional coupler for insertion into a line for transmitting wide band signals that are a center conductor and a grounded outer conductor comprising:
an input terminal and an output terminal for connecting the coupler in series with the center conductor of the transmission line,
an output tap point,
a shunt transformer and a series transformer each having a primary winding and a secondary winding,
the primary winding of said shunt transformer being connected between ground and one side of the primary of said series transformer and the other side of the primary of said series transformer being connected to the output terminal of the coupler, the secondary winding of the series transformer being connected to ground on one side and said output tap point on the other side,
an intermediate tap on the windings of the primary winding of the shunt transformer that is connected to the input terminal of the coupler whereby a portion of said windings is positioned between the intermediate tap and the primary winding of the series transformer whereby the impedance at the input to the series transformer is greater than the characteristic impedance of the transmission line, and
the secondary of said shunt transformer being connected to ground on one side and to said output tap point on the other side whereby a pair of in phase sample signals is applied to the output tap point when the transformers are energized by the wide band signals transmitted along the line in a direction from the input terminal of the coupler towards the output terminal.

5. The directional coupler of claim 4 wherein a single turn of the primary winding of said shunt transformer is placed between the input terminal of the coupler and the input to the series transformer.

6. The directional coupler of claim 4 further comprising a resistor positioned between the output sides of the two secondary windings.

7. A directional coupler for insertion into a line for transmitting wide band signals that has a center conductor and a grounded outer conductor comprising:
an input terminal and an output terminal for connecting said coupler in series with the center conductor for the transmission line;
an output tap point;
a first transformer having an input winding, an intermediate tap connected to said input terminal which divides said input winding into a first section of $N_1$ turns and a second section of $N_2$ turns, said second section being connected to said outer conductor, and an output means connected to said output tap point for supplying output signals corresponding to signals passing through said first transformer input winding to said output tap point; and,
a second transformer having an input winding connected in series between the first section of said first transformer input winding and said output terminal for raising the impedance at the input to said second transformer to a level greater than the characteristic impedance of the transmission line, and an output means connected to said output tap point for supplying output signals corresponding to signals passing through said second transformer input winding to said output tap point.

8. The directional coupler of claim 1 wherein said first transformer is an autotransformer.

9. The directional coupler of claim 1 wherein said first tranformer contains a primary and a secondary section.

10. The directional coupler of claim 1 wherein $N_1$ is a single turn.

* * * * *